United States Patent [19]
Aiso et al.

[11] Patent Number: 5,858,852
[45] Date of Patent: Jan. 12, 1999

[54] FABRICATION PROCESS OF A STACK TYPE SEMICONDUCTOR CAPACITIVE ELEMENT

[75] Inventors: Fumiki Aiso; Toshiyuki Hirota, both of Tokyo, Japan

[73] Assignee: NEC Corporation, Tokyo, Japan

[21] Appl. No.: 853,744

[22] Filed: May 9, 1997

[30] Foreign Application Priority Data

May 9, 1996 [JP] Japan ..................................... 8-114637

[51] Int. Cl.[6] .................................................. H01L 21/20
[52] U.S. Cl. ........................... 438/396; 438/255; 438/398
[58] Field of Search ..................... 438/253, 255, 438/396, 398

[56] References Cited

U.S. PATENT DOCUMENTS

| | | |
|---|---|---|
| 5,418,180 | 5/1995 | Brown . |
| 5,639,689 | 6/1997 | Woo ........................................ 438/398 |
| 5,663,085 | 9/1997 | Tanigawa ............................... 438/398 |

FOREIGN PATENT DOCUMENTS 5-90490  4/1993  Japan .
5-304273 11/1993 Japan .

OTHER PUBLICATIONS

Japanese Office Action, mailed Mar. 3, 1998, in corresponding JPA No. 8114637/1996 (translation of relevancy submitted herewith).

*Primary Examiner*—Tuan H. Nguyen
*Attorney, Agent, or Firm*—Sughrue, Mion, Zinn, Macpeak & Seas, PLLC

[57] ABSTRACT

At first, a silicon oxide layer is selectively formed on the surface of a semiconductor substrate. Next, a first amorphous silicon film doped with phosphorous in the concentration of about $1 \times 10^{20}$ (atoms/cm$^3$) and a non-doped second amorphous silicon film are deposited in sequential order. By this, an amorphous silicon layer for lower electrode constituted of the first and second amorphous silicon films is formed. Then, an HSG (unevenness) is formed on the surface of the amorphous silicon layer for lower electrode. Subsequently, the amorphous silicon layer for lower electrode is patterned to form a lower electrode of the stack type capacitive element. Thereafter, a capacitance insulation layer is formed on the upper surface and the side surface of the lower electrode. Then, over the entire surface, an upper electrode is deposited.

22 Claims, 9 Drawing Sheets

FABRICATION PROCESS OF A STACK TYPE SEMICONDUCTOR CAPACITIVE ELEMENT

BACKGROUND OF THE INVENTION

1. Field of the Invention

The present invention relates to a fabrication process of a semiconductor capacitive element to be employed in DRAM or so forth. More specifically, the invention relates to a fabrication process of a stack type semiconductor capacitive element which can improve an accumulated charge amount of a lower electrode.

2. Description of the Prior Art

In a semiconductor device, especially in a technology forming a lower electrode of a capacitive element in DRAM or so forth, a technology for forming an HSG (Hemispherical Grain) on the surface of a silicon electrode (an HSG technology) is frequency used, in the recent years.

FIGS. 1A to 1E are sections showing a fabrication process steps of a capacitive element using the HSG technology in sequential order. At first, as shown in FIG. 1A, a silicon oxide layer 11 to be an isolation region is formed in a thickness of 300 nm, by selectively oxidizing the surface of an n-type semiconductor substrate 10. The n-type semiconductor substrate 10 may be an n-type impurity region formed on the surface of the semiconductor substrate.

Next, as shown in FIG. 1B, an amorphous silicon film 12 doped with phosphorous is formed over the entire surface in a thickness of 150 nm, by way of thermal CVD technology. The amorphous silicon film 12 is formed by introducing a 100% $SiH_4$ gas having flow velocity of 1000 sccm and 1% $PH_3$ gas diluted by a nitrogen gas, having flow velocity of 10 sccm, and maintaining this at about 530° C. under 1 Torr of pressure, for about one hour. By this deposition condition, the amorphous silicon film 12 having phosphorous concentration of about $5\times10^{19}$ (atoms/cm$^3$), is formed.

Next, as shown in FIG. 1C, an HSG, namely a silicon crystal having hemisphere unevenness having a diameter of about 50 to 100 nm, is formed on the surface of the amorphous silicon film 12. Process of fabricating the HSG will be discussed later.

Subsequently, as shown in FIG. 1D, the amorphous silicon film 12 is patterned using lithographic technology and dry etching technology, to form a stack electrode, namely a lower electrode 12a of the capacitive element.

Thereafter, as shown in FIG. 1E, a silicon nitride layer to be a capacitance insulation layer is formed on the lower electrode 12a in a thickness about 7 nm, using a thermal CVD technology. Then, on these surface, an upper electrode 13 of the capacitive element of a polycrystalline silicon layer is formed in a thickness of about 150 nm. Then, for electrically activating, heat treatment is performed under gas atmosphere in the presence of phosphorous oxytrichloride. By this, the stack type semiconductor capacitive element is formed.

In the semiconductor capacitive element constructed as set forth, the HSG is formed on the surface of the amorphous silicon film 12 to be the lower electrode to increase the surface area. Therefore, the accumulated charge amount of the lower electrode can be increased.

Next, a method for forming the HSG on the surface of the amorphous silicon film 12 will be explained. As a fabrication process of the HSG, there are an annealing method disclosed in Japanese Unexamined Patent Publication No. 5-90490 and a nucleus forming method as disclosed in Japanese Unexamined Patent Publication No. 5-304273. At first, discussion will be given for annealing method.

As shown in FIG. 1B, in the annealing method, after formation of the amorphous silicon film 12, without removing the substrate from a layer deposition chamber while maintaining the chamber at a layer deposition temperature under reduced pressure, the HSG is formed. Specifically, after forming the amorphous silicon film 12 at a layer deposition temperature of 570° C. under 0.2 Torr of pressure, heat treatment is subsequently effected under a reduced pressure for one hour to form the HSG on the surface of the amorphous silicon film 12. The annealing method is advantageous because forming the HSG can be achieved by using only the layer deposition furnace.

It should be noted that the HSG technology is a technology in which silicon atom on the surface of the amorphous silicon film is migrated by heat treatment to form clusters on the surface for forming surface unevenness. Migration of silicon atoms is significantly lowered by presence of contaminant, such as a natural oxidation layer, or the like, on the surface of the amorphous silicon film. Since the annealing method is a technology of performing heat treatment after deposition of the amorphous silicon film without taking the device out of the layer deposition chamber a, clean surface can be easily obtained before heat treatment. Accordingly, when the condition, such as temperature, pressure and so forth, in the chamber is constant, the HSG can be formed stably without any contamination from, for example, natural oxide.

Next, discussion will be given for nucleus forming method. The semiconductor substrate, on which the amorphous silicon film is formed, is mounted within the chamber (not shown). Disilane gas is introduced into the chamber to perform heat treatment for this substrate at a temperature of about 600° C. By this, crystal nucleus of the HSG is formed on the surface of clean amorphous silicon film. Next, without removing from the chamber (not shown), annealing is performed. The annealing is performed at the same temperature as the temperature fore forming the crystal nucleus of the HSG, or at a maximum of 650° C. Thus, silicon molecule form on the surface of amorphous silicon film surrounding the crystal nucleus, by migration, and aggregate to form the HSG on the surface of the amorphous silicon film.

Such nucleus forming method is implemented by two separate steps including a step of forming crystal nucleus of the HSG using a silane type gas and a step of annealing without introducing a layer deposition gas. Accordingly, the nucleus forming method is advantageous to control the grain diameter of the HSG by controlling the annealing condition in the annealing step, for example.

On the other hand, when the step of forming crystal nucleus is implemented under a pressure lower than or equal to 1 Torr, crystal nucleus is not formed on the silicon oxide layer and is only formed on the surface of the amorphous silicon film. Accordingly, the nucleus forming method is advantageous for capability of control of the forming density of the HSG by controlling a forming condition in the crystal nucleus forming step.

FIGS. 2A to 2C are sections showing process steps of one example of fabrication process of the HSG by nucleus forming method in sequential order. In FIGS. 2A to 2C, like elements to those in FIGS. 1A to 1E will be identified by like reference numerals, and detailed description therefor will be neglected. At first, in the similar manner to the method shown in FIGS. 1A and 1B, within the layer deposition chamber (not shown), the amorphous silicon film 12 is formed on the surfaces of a substrate 10 and a silicon oxide layer 11 which is selectively formed on the surface of the substrate.

Next, after taking the substrate out of the layer deposition chamber, as shown in FIG. 2A, utilizing lithographic technology and dry etching technology, the amorphous silicon film 12 is patterned to form a patterned amorphous silicon film 12b.

Subsequently, after mounting the substrate within the layer deposition chamber, the HSG is formed on the surface of the patterned amorphous silicon film 12b by way of nucleus forming method. At this time, since the forming condition of the crystal nucleus is appropriately controlled, the crystal nucleus is not formed on the silicon oxide layer 11. Thus, the lower electrode 12a is formed.

The process steps after formation of the HSG is similar to those in the annealing method. Namely, as shown in FIG. 2C, the silicon nitride layer (not shown), the capacitance insulation layer, is deposited to a thickness of about 7 nm on the lower electrode 12a. Then, on these surfaces, the upper electrode 13 of the capacitive element made of polycrystalline silicon is deposited. Thus, the semiconductor capacitive element is obtained.

The HSG forming method shown in FIGS. 2A to 2C is a method for forming the crystal nucleus in the condition where the crystal nucleus is formed only on the surface of the amorphous silicon film. Accordingly, after patterning the amorphous silicon film 12 to form the patterned amorphous silicon film 12b, the HSG can be formed on the surface of the patterned amorphous silicon film 12b. By this, the HSG is also formed on the side surface of the patterned amorphous silicon film 12b. Therefore, the nucleus forming method as shown in FIGS. 2A to 2C can further to increase the surface area of the lower electrode in comparison with the annealing method.

Thus, in the case where the HSG is formed by the conventional methods on the surface of amorphous silicon film, good shape of the HSG can be formed when the amorphous silicon film is not doped or has low impurity concentration where phosphorous concentration is lower than or equal to about $5 \times 10^{19}$ (atoms/cm$^3$).

However, when the HSG is formed by the conventional method utilizing amorphous silicon film having low impurity concentration, the following problems are encountered. FIG. 3 is a graph showing a relationship between capacitance and bias voltage with taking the capacitance with respect to the maximum capacitance in the vertical axis and bias voltage to be applied to the upper electrode in the horizontal axis. In FIG. 3, a solid line 1 shows variation of capacitance of the capacitive element formed with the HSG on the surface of amorphous silicon film having P-type impurity concentration of $5 \times 10^{19}$ atoms/cm$^3$). On the other hand, in FIG. 3, the broken line 2 shows variation of the capacitance of the capacitive element forming amorphous silicon film having p-type impurity concentration of $1 \times 10^{20}$ (atoms/cm$^3$), in which the HSG is not formed on the surface of the silicon film.

As shown by solid line in FIG. 3, when a positive bias is applied to the upper electrode, if the impurity concentration in the amorphous silicon film (lower electrode) is low, depletion layer is widened to lower effective capacitance. On the other hand, as shown by broken line 2, when the impurity concentration is increased in the amorphous silicon film, even if the bias is applied to the upper electrode, only a little drop of the capacitance is caused.

Namely, even when the surface area of the amorphous silicon film doubles by forming the HSG, if the capacitance value is lowered in the proportion of 30% by widening of the depletion layer, the actual increase of the capacitance value becomes only 1.4 times. Accordingly, when the charge accumulation amount of the capacitive element is to be increased by forming the HSG on the surface of the amorphous silicon film, higher impurity concentration in the amorphous silicon film is desirable. When the impurity concentration is higher than or equal to $1 \times 10^{20}$ (atoms/cm$^3$), widening of the depletion layer can be suppressed.

On the other hand, when the HSG is formed on the amorphous silicon film by the conventional process with utilizing the amorphous silicon film having high impurity (phosphorous) concentration, such as higher than or equal to $1 \times 10^{20}$ (atoms/cm$^3$), is used, the following problems exist. Namely, when the HSG is formed on the surface of the amorphous silicon film having high impurity concentration, the forming period of the crystal nucleus of the HSG and surface migration period of silicon molecule becomes longer in comparison with the case where non-doped amorphous silicon film is used. Thus, the density and the average grain size of the HSG formed becomes smaller.

On the other hand, in the case of forming the amorphous silicon film doped with the impurity, such as phosphorous or the like, crystallization speed of the bulk is higher than that of the non-doped amorphous. Accordingly, when a temperature for forming the HSG is elevated or a period for forming the HSG is prolonged, the amorphous silicon film may be crystallized from the substrate side during the HSG forming process. Then, crystallization reaches the surface of the silicon film before the HSG is formed, surface migration of the silicon molecule for forming the HSG is blocked and causes failure of HSG formation.

From this fact, when the HSG is formed on the surface of the amorphous silicon film doped with the impurity, and if it is desired to form good shape of the HSG, it is preferred that the forming condition is high temperature and long period. On the other hand, for avoiding occurrence of failure of formation of the HSG due to crystallization of the amorphous silicon film, the desirable forming condition is low temperature and short period. As a result, when the HSG is formed on the amorphous silicon film having high impurity concentration, the forming condition becomes significantly narrow. Accordingly, in the prior art, it has been difficult to form the HSG on the surface of the electrode (amorphous silicon film) having high impurity concentration.

In order to solve such problem, there is a method, in which an amorphous silicon film having low phosphorous concentration is formed, the HSG is formed on the surface thereof, and then phosphorous is doped in the amorphous silicon film by way of ion implantation or the like. By this it becomes possible to form the electrode (amorphous silicon film) having high impurity concentration, with the HSG on the surface.

However, when ion implantation is performed after formation of the HSG on the surface of the amorphous silicon film, the HSG crystal can be broken by ion implantation. By this, the surface of the amorphous silicon film formed with the HSG may return to an original flat surface. Accordingly, even when the impurity concentration in the amorphous silicon film is increased by ion implantation, capacity cannot be increased sufficiently because the HSG is destroyed by the ion implantation.

SUMMARY OF THE INVENTION

It is an object of the present invention to provide a fabrication process of a stack type semiconductor capacitive element, in which uniform and good shape of unevenness can be formed on the surface of the amorphous silicon film having impurity concentration greater than or equal to $1\times10^{20}$ (atoms/cm$^3$), and by this, a capacitance of the lower electrode of the semiconductor capacitive element can be increased.

In a fabrication process of a stack type semiconductor capacitive element, according to the present invention, at first, an insulation layer is selectively formed on the surface of a semiconductor substrate for defining an element region. Next, a first amorphous silicon film with an impurity concentration greater than or equal to $1\times10^{20}$ (atoms/cm$^3$) is formed on the element region. Then, a second amorphous silicon film which is not doped or restricted the impurity concentration to be less than or equal to $1\times10^{18}$ (atoms/cm$^3$) is formed over the first amorphous silicon film. The second amorphous silicon film and the first amorphous silicon film constituting an amorphous silicon layer for lower electrode. Subsequently, unevenness is formed on the surface of the amorphous silicon layer for lower electrode by a heat treatment.

The fabrication process of a semiconductor capacitive element further comprises the step of performing patterning for the amorphous silicon layer for lower electrode after the step formation of the unevenness to form the lower electrode, the step of forming a capacitance insulation layer on the surface of the lower electrode and the step of forming an upper electrode over the surface of the capacitance insulation layer.

The first amorphous silicon film may contain phosphorous as an impurity.

The step of forming the first amorphous silicon film may have a step of depositing the first amorphous silicon film by a reaction under atmosphere of gas containing a silane type gas and the impurity. The step of forming the second amorphous silicon film may have a step of depositing the second amorphous silicon film by a reaction under atmosphere of gas containing only the silane type gas.

The first and second amorphous silicon films are preferably formed at temperature in a range of 520° to 550° C.

It is preferred that the step of forming the unevenness has a step of performing heat treatment for the amorphous silicon layer for lower electrode at temperature in a range of 550° to 580° C.

The step of forming the unevenness may have a step of performing heat treatment for the amorphous silicon layer for lower electrode at a temperature in a range of 550° to 580° C. under silane type gas atmosphere, and a step of leaving at the same temperature and the same pressure as that in the heat treatment process. It should be noted that the forming temperature of the amorphous silicon films and heat treatment temperature of the amorphous silicon layer for lower electrode set forth above are not essential and the present invention should not be limited to the specific ranges.

Furthermore, the semiconductor substrate may be made of an n-type semiconductor layer or may have an n-type semiconductor region on the surface.

In a fabrication process of a stack type semiconductor capacitive element, according to another aspect of the present invention, at first an insulation layer is selectively formed on the surface of a semiconductor substrate for defining an element region. Then, a first amorphous silicon film with an impurity concentration greater than or equal to $1\times10^{20}$ (atoms/cm$^3$) is formed on the element region. Then, a second amorphous silicon film which is not doped or restricted the impurity concentration to be less than or equal to $1\times10^{18}$ (atoms /cm$^3$) is formed over the first amorphous silicon film. The second amorphous silicon film and the first amorphous silicon film constituting an amorphous silicon layer for lower electrode. Thereafter, the amorphous silicon layer for lower electrode is patterned to form a patterned amorphous silicon layer. Then, a side wall of amorphous silicon not doped or restricted the impurity concentration to be less than or equal to $1\times10^{18}$ (atoms/cm$^3$) is formed on the side surface of the patterned amorphous silicon layer. Subsequently, unevenness is formed on the surfaces of the patterned amorphous silicon layer and the side wall by heat treatment and whereby forming the lower electrode having patterned amorphous silicon layer and the side wall with the unevenness.

The step of forming the first amorphous silicon film may have a step of depositing the first amorphous silicon film by a reaction under atmosphere of gas containing a silane type gas and the impurity. The step of forming the second amorphous silicon film may have a step of depositing the second amorphous silicon film by a reaction under atmosphere of gas containing only the silane type gas. And the step of forming the side wall may have a step of forming a third amorphous silicon film on upper surface and side surface of the patterned amorphous silicon layer, and a step of performing anisotropic etching for leaving the third amorphous silicon film only on the side surface of the patterned amorphous silicon layer.

The first to third amorphous silicon films may be formed at a forming temperature in a range of 520° to 550° C.

It is preferred that step of forming the unevenness has a step of performing heat treatment for the patterned amorphous silicon layer and the side wall at a temperature in a range of 550° to 580° C. The step of forming the unevenness may have a step of performing heat treatment for the patterned amorphous silicon layer and the side wall at temperature in a range of 550° to 580° C. under silane type gas atmosphere, and a step of leaving at the same temperature and the same pressure as that in the heat treatment process. It should be noted that the forming temperature of the amorphous silicon films and heat treatment temperature of the patterned amorphous silicon layer set forth above are not essential and the present invention should not be limited to the specific ranges.

In the present invention, the second amorphous silicon film having low impurity concentration is formed on the first amorphous silicon film having high impurity concentration. The HSG is formed on the amorphous silicon layer for lower electrode consists of the first and second amorphous silicon films. Therefore, failure of formation of the HSG will never be caused and uniform and good shape of the HSG can be formed. Also, it can be prevented to spread the depletion layer to lower capacitance of the lower electrode. Accordingly the capacitance of the lower electrode can be increased.

On the other hand, in the present invention, after patterning the amorphous silicon layer for lower electrode to form the patterned amorphous silicon layer, the side wall of amorphous silicon which is not doped or has low impurity concentration is formed. Then, the HSG is formed on the surfaces of the patterned amorphous silicon layer and side wall. Thus, the uniform and good shape of the HSG can be also formed on the side surface of the lower electrode. By this, the capacitance of the lower electrode can be further increased.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1A:
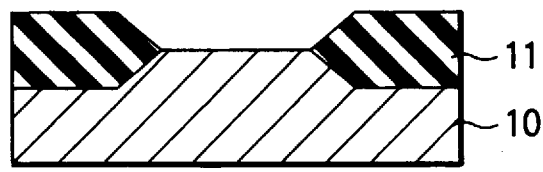
FIGS. 1A to 1E are sections showing a fabrication process of a capacitive element using an HSG technology, in sequential order.
Figure 1B:
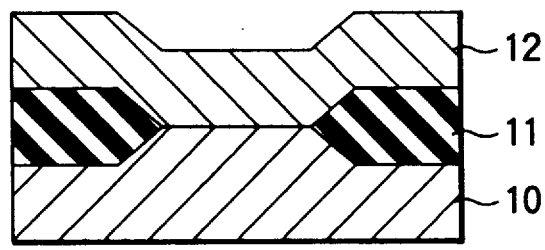
Figure 1C:
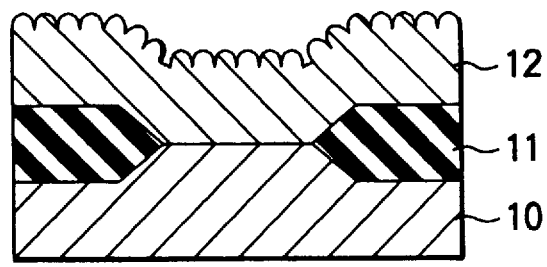
Figure 1D:
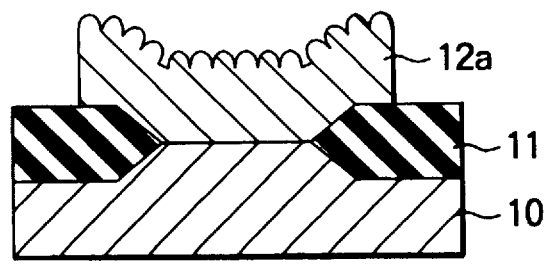
Figure 1E:
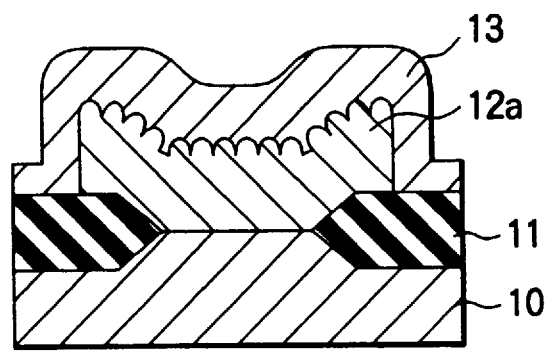
Figure 2A:
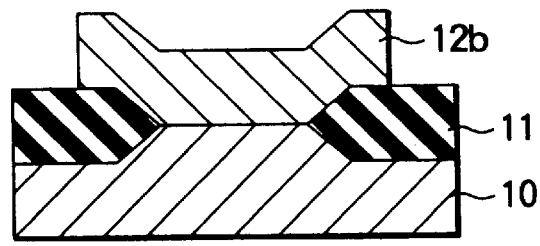
FIGS. 2A to 2C are sections showing one example of fabrication process of the HSG by nucleus forming method, in sequential order.
Figure 2B:
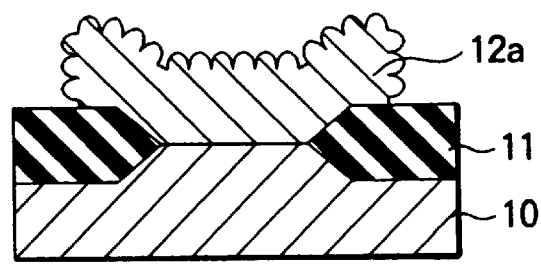
Figure 2C:
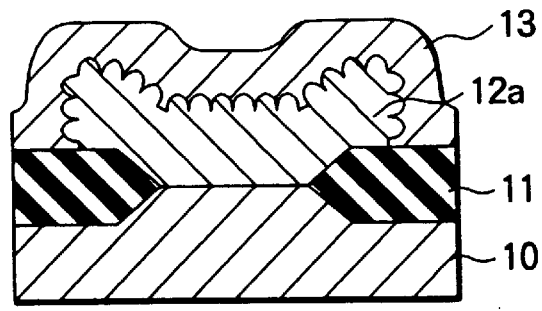
Figure 3:
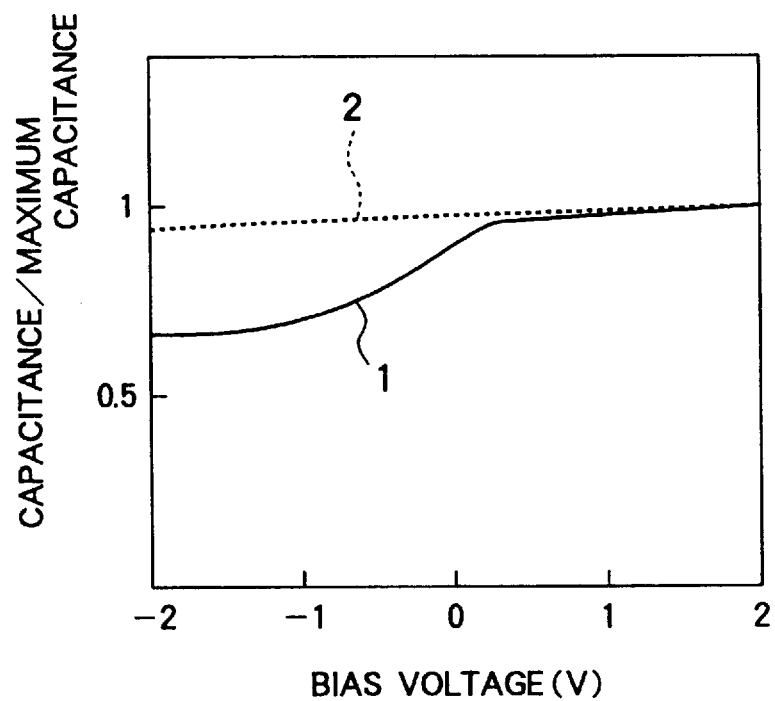
FIG. 3 is a graph showing a relationship between capacitance and bias voltage with taking the capacitance with respect to the maximum capacitance in the vertical axis and bias voltage applied to the upper electrode in the horizontal axis.
Figure 4A:
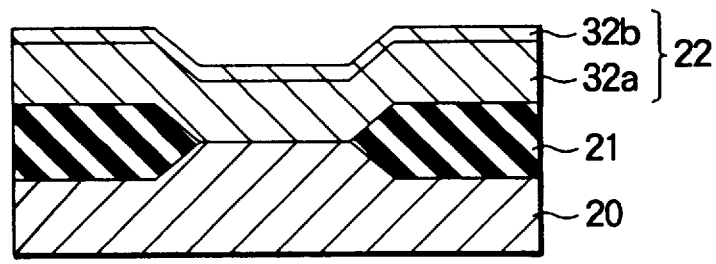
FIGS. 4A to 4C are sections showing process steps in the first embodiment of a fabrication process of a semiconductor capacitive element according to the present invention, in sequential order.
Figure 4B:
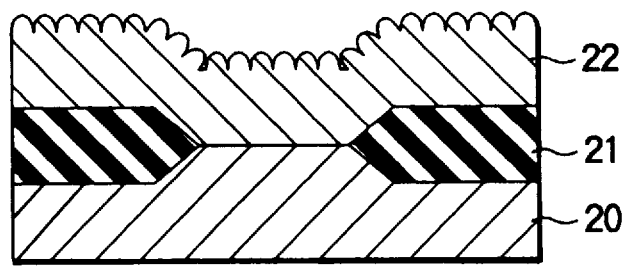
Figure 4C:
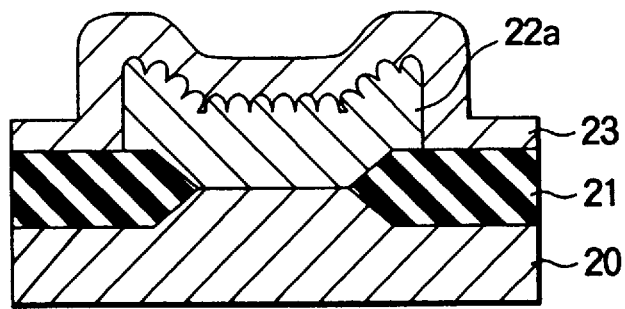

FIGS. 4A to 4C are sections showing process steps in the first embodiment of a fabrication process of a semiconductor capacitive element according to the present invention, in sequential order. At first, as shown in FIG. 4A, a silicon oxide layer 21 to be an isolation region is formed in a thickness of 300 nm by selectively oxidizing a predetermined region of the surface of an n-type semiconductor substrate 20. It is also possible to use a semiconductor substrate having an n-type impurity region on the surface, in place of the n-type semiconductor substrate 20.

Next, over the entire surface, a first amorphous silicon film 32a doped with phosphorous in the concentration of about $2\times10^{20}$ (atoms/cm$^3$) is formed in a thickness of 250 nm. Next, a non-doped second amorphous silicon film 32b is formed in a thickness of 50 nm on the surface of the first amorphous silicon film 32a. By this, an amorphous silicon layer 22 for lower electrode constituted of the second amorphous silicon film 32b and the first amorphous silicon film 32a, is formed.

Subsequently, as shown in FIG. 4B, an HSG (unevenness) is formed on the surface of the amorphous silicon layer 22 for lower electrode. The forming condition of the amorphous silicon layer 22 for lower electrode and the forming method of the HSG will be discussed later.

Subsequently, as shown in FIG. 4C, the amorphous silicon layer 22 for lower electrode is patterned using a lithographic technology and a dry etching technology, to form the lower electrode 22a of a stack type semiconductor capacitive element. Thereafter, a silicon nitride layer (not shown) to be a capacitive insulation layer is formed in a thickness of about 7 nm on the upper surface and the side surface of the lower electrode 22a using a thermal CVD technology. Then, over the entire surface, an upper electrode 23 formed of a polycrystalline silicon layer of the capacitive element is deposited in a thickness of about 150 nm. Subsequently, for electrically activating these, heat treatment is performed under atmosphere of gas containing phosphorous oxytrichloride. Thus, the stack type semiconductor capacitive element is formed.

Figure 5:
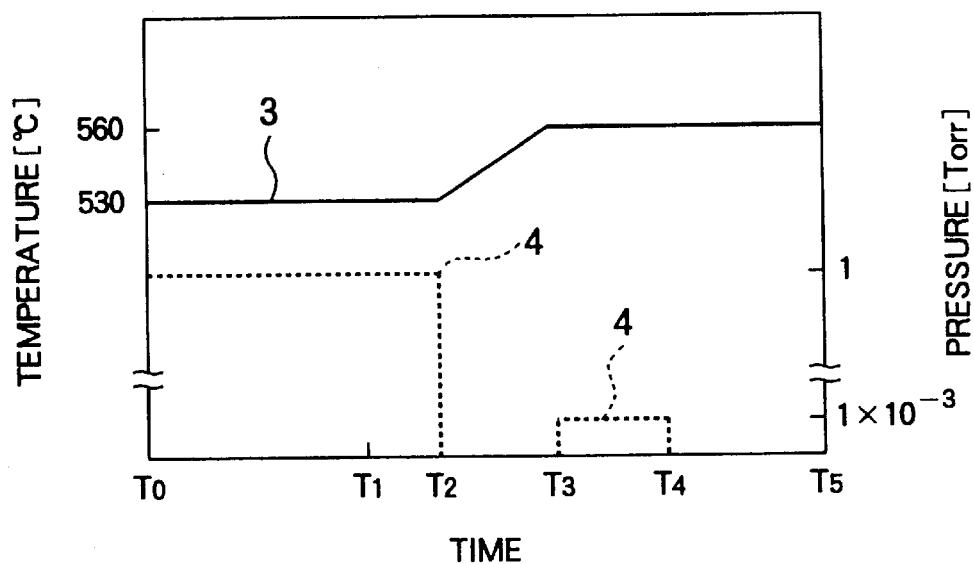
FIG. 5 is a graph showing a relationship between temperature and pressure and time in fabrication of amorphous silicon films and the HSG with taking temperature and pressure in the vertical axis and time in the horizontal axis.
Figure 6:
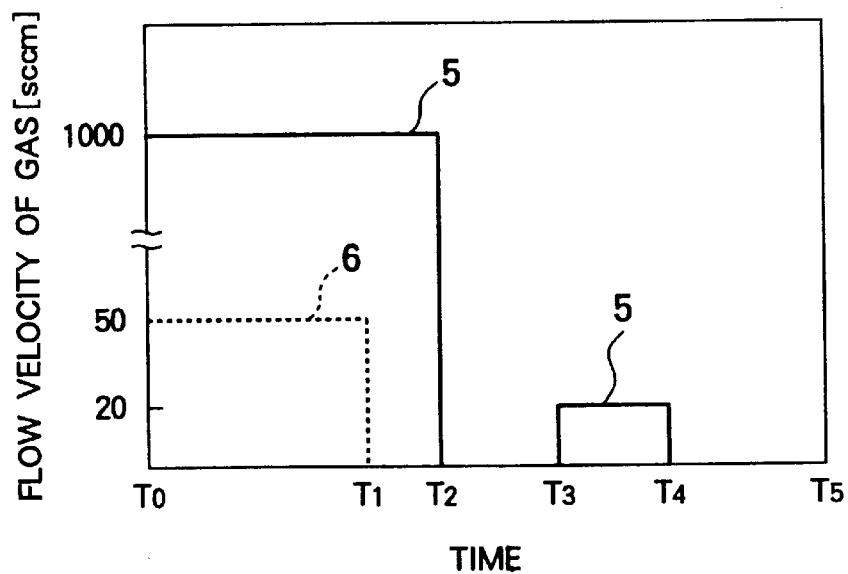
FIG. 6 is a graph showing a relationship between flow velocity of gas and time during formation of amorphous silicon films and the HSG with taking flow velocity of gas in the vertical axis and time in the horizontal axis.

Next, formation condition of the amorphous silicon layer 22 for lower electrode and the forming method of the HSG will be discussed specifically hereinafter. FIG. 5 is a graph showing a relationship between temperature and pressure and time in fabrication of amorphous silicon films and the HSG with taking temperature and pressure in the vertical axis and time in the horizontal axis. FIG. 6 is a graph showing a relationship between flow velocity of gas and time during formation of amorphous silicon films and the HSG with taking flow velocity of gas in the vertical axis and time in the horizontal axis. In FIG. 5, a solid line 3 shows a temperature in a low pressure furnace, and a broken line 4 represent a pressure in the low pressure furnace. In FIG. 6, a solid line 5 shows flow velocity of SiH$_4$ gas, and a broken line 6 shows flow velocity of PH$_3$ diluted by N$_2$ gas.

As shown in FIGS. 5 and 6, at first, a substrate is mounted in a CVD low pressure furnace. 100% SiH$_4$ gas of flow velocity of 1000 sccm and 1% PH$_3$ gas diluted by N$_2$ gas of flow velocity of 10 sccm are introduced into a reaction pipe as a layer forming gas. Then, the substrate is maintained within the CVD low pressure furnace at a temperature of about 530° C. under a pressure of about 1 Torr, for about one hour and forty minutes. By this, the first amorphous silicon film 32a having a phosphorous concentration of about $2\times10^{20}$ (atoms/cm$^3$) is formed in a thickness of 250 nm. It should be noted that the film forming step of the first amorphous silicon film 32a is performed within a period of $T_0$ to $T_1$ in FIGS. 5 and 6.

Next, in the condition where the substrate is mounted in the CVD low pressure furnace, only supply of the PH$_3$ gas is stopped. Then the substrate is maintained for 20 minutes. By this, the non-doped second amorphous silicon film 32b are formed in a thickness of 50 nm on the surface of the first amorphous silicon film 32a. Thus, the amorphous silicon layer 22 for lower electrode is formed with the second amorphous silicon film 32b and the first amorphous silicon film 32a. It should be noted that the film forming step of the second amorphous silicon film 30b is performed within a period of $T_1$ to $T_2$ in the drawings.

Subsequently, in the condition where the substrate is mounted in the CVD low pressure furnace, the pressure in the CVD low pressure furnace is lowered to the reached vacuum pressure and the temperature is increased to about 560° C. This step is performed within a period of $T_2$ to $T_3$ in the drawings.

After elevating a temperature, $SiH_4$ gas is again introduced into the low pressure furnace for flow velocity of about 20 sccm for 20 minutes to form the crystal nucleus of the HSG. This nucleus forming step is performed within a period of $T_3$ to $T_4$ in the drawings.

Subsequently, under the condition where the temperature of 560° C. in the low pressure furnace is maintained, the substrate is maintained under the reached vacuum pressure for 20 minutes. By this, the nucleus grows. Then, the substrate is removed from the low pressure furnace. This annealing step is performed during a period of $T_4$ to $T_5$ in the drawing. Thus, the HSG can be formed on the surface of the amorphous silicon layer 22 having high impurity concentration of about $2 \times 10^{20}$ (atoms/cm$^3$).

Thus, in the shown embodiment, since the surface of the amorphous silicon layer 22 for lower electrode, in which the nucleus is formed, namely the second amorphous silicon film 32b, is non-doped and growth of the HSG is not prevented and a problem does not occur to make the forming density lower and average grain size smaller. Accordingly, it is not necessary to set the forming temperature of the HSG high and to make the forming temperature long, in comparison with the crystallization velocity of the first amorphous silicon film 32a, the good shape of the HSG can be formed faster on the surface of the second amorphous silicon film 32b.

In the shown embodiment, immediately after formation of the HSG, the surface of the silicon layer 22 for lower electrode where the HSG is formed (second amorphous silicon film 32b) is in substantially non-doped condition. However, in the subsequent step of forming silicon nitride layer or the heat treatment step for activating the upper electrode, phosphorous in the first amorphous silicon film 32a is diffused in the second amorphous silicon film 32b. Accordingly, even when a bias is applied to the upper electrode 23 of the capacitive element, the depletion layer does not spread.

Also, while the non-doped second amorphous silicon film 32b in the shown embodiment is formed, the similar effect may be obtained by forming the amorphous silicon film 32b having low impurity concentration (less than or equal to $1 \times 10^{18}$ (atoms/cm$^3$)).

Also, when a silicon oxide layer is present as a base layer of the first amorphous silicon film 32a, if the layer forming temperature of the first and second amorphous silicon films 32a and 32b exceeds 550° C., local crystallization of the amorphous silicon film is caused from the substrate side. Accordingly, even when the phosphorous concentration of the first amorphous silicon film 32a is controlled, in the HSG formation step, it is possible that completely good shape of the HSG is not obtained. Such local crystallization is more difficult at lower layer forming temperature of the amorphous silicon film. However, when the layer forming temperature is lower than 520° C., the layer forming speed becomes lower than or equal to 1.5 (nm/min), and thus is not practical. Accordingly, the layer forming temperature of the first and second amorphous silicon films 32a and 32b are desirable to be within a temperature range of 520° to 550° C.

Furthermore, in the shown embodiment, while the nucleus of the HSG is formed at a temperature of 560° C., in the present invention, by performing nucleus forming of the HSG and annealing at a temperature about 550° C., crystallization speed of the amorphous silicon films can be lowered. In the nucleus forming step and the annealing step, good shape of the HSG can be formed in a temperature range of 550° to 580° C. However, in the present invention, layer forming temperature of the amorphous silicon films, the nucleus forming temperature of the HSG and an annealing temperature are not limited to the foregoing range.

FIGS. 7A to 7F are sections showing the process steps in the second embodiment of the fabrication process of the semiconductor capacitive element according to the present invention. In the capacitive element shown in FIGS. 7A to 7F, like elements to those shown in FIGS. 4A to 4C will be identified by like reference numerals and detailed description thereof will be neglected for keeping the disclosure simple enough to facilitate clear understanding of the present invention.

Figure 7A:
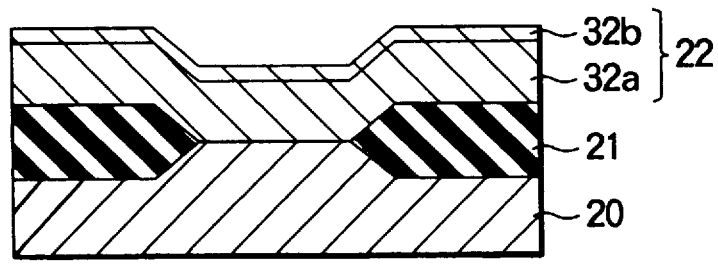
FIGS. 7A to 7F are sections showing the process steps in the second embodiment of a fabrication process of the semiconductor capacitive element according to the present invention, in sequential order.

At first, as shown in FIG. 7A, the silicon oxide layer 21 to be an isolation region is formed in a thickness of 250 nm by selectively oxidizing a predetermined region of the surface of the n-type semiconductor substrate 20. It is also possible to use a semiconductor substrate having an n-type impurity region on the surface, in place of the n-type semiconductor substrate 20.

Next, 100% $SiH_4$ gas of flow velocity of 1000 sccm and 1% $PH_3$ gas diluted by $N_2$ gas of flow velocity of 50 sccm are introduced into a reaction pipe as a layer forming gas. Then, the substrate is maintained within the CVD low pressure furnace at a temperature of about 530° C. under a pressure of about 1 Torr, for about two hours. By thermal CVD method, the first amorphous silicon film 32a having a phosphorous concentration of about $2 \times 10^{20}$ (atoms/cm$^3$) is formed in a thickness of 300 nm.

Next, in the condition where the substrate is mounted in the CVD low pressure furnace, only supply of the $PH_3$ gas is stopped. By this, the non-doped second amorphous silicon film 32b are formed in a thickness of 70 nm on the surface of the first amorphous silicon film 32a. Thus, the amorphous silicon layer 22 for lower electrode is formed with the second amorphous silicon film 32b and the first amorphous silicon film 32a.

Figure 7B:
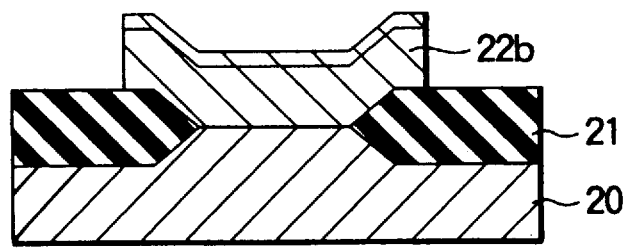

Subsequently, as shown in FIG. 7B, the amorphous silicon layer 22 for lower electrode is patterned using a lithographic technology and a dry etching technology, to form the patterned amorphous silicon layer 22b.

Figure 7C:
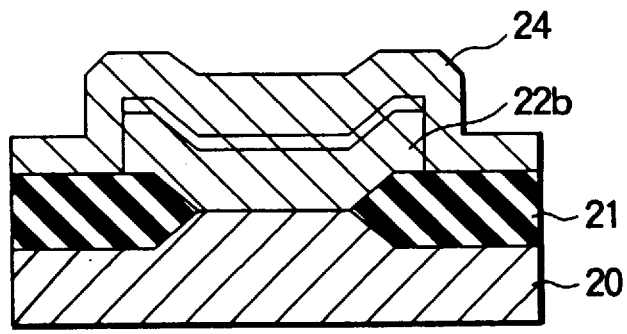

Then, as shown in FIG. 7C, in the CVD low pressure furnace, under the similar condition to the forming condition of the second amorphous silicon film 32b, a non-doped third amorphous silicon film 24 is formed over the surfaces of the patterned amorphous silicon layer 22b and the silicon oxide layer 21 in a thickness of 100 nm.

Figure 7D:
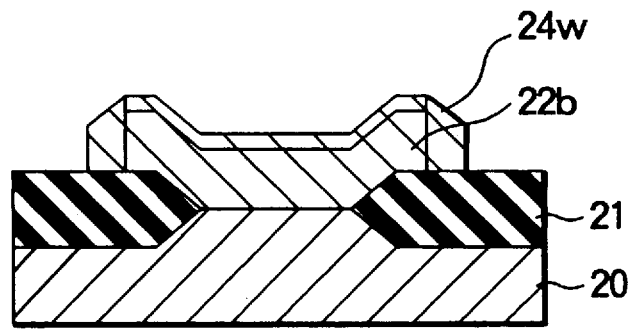

Subsequently, as shown in FIG. 7D, by way of anisotropic dry etching, and under a condition where about 120 nm of third amorphous silicon film 24 is etched, etching is performed. By this, the third amorphous silicon film 24 is left only on the side surface of the patterned amorphous silicon layer 22b to form the side wall 24w of non-doped amorphous silicon. Accordingly, the patterned amorphous silicon layer 22b may have a structure covered with the non-doped amorphous silicon film over the entire surface.

Thereafter, using aqueous solution of fluorine, contaminant, such as silicon oxide layer or the like, is removed from the surface of the patterned amorphous silicon layer 22b and the side wall 24w (surface of the non-doped amorphous silicon layer). Thereafter, in the condition where the temperature of 550° C. in the low pressure furnace, under vacuum condition of 0.5 mTorr, $SiH_4$ gas is introduced in flow velocity of 20 sccm, and left for 20 minutes. By this, nucleus of silicon is produced on the surfaces of the patterned amorphous silicon layer 22b and the side wall 24w.

Figure 7E:
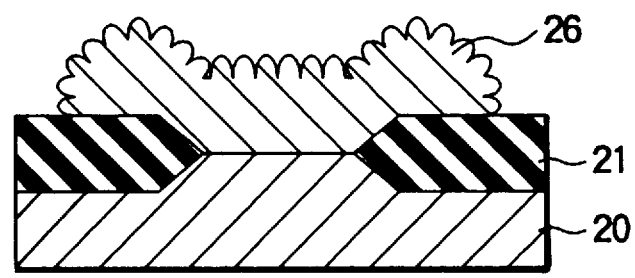
Figure 7F:
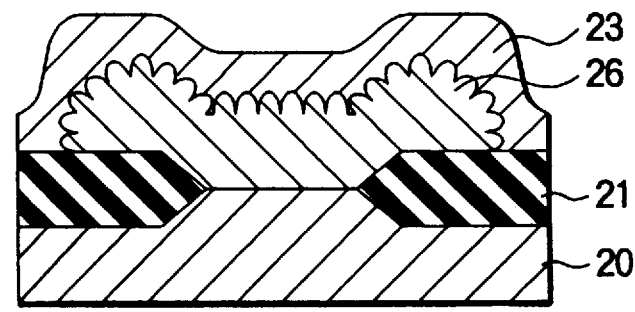

Thereafter, as shown in FIG. 7E, under the condition where the temperature of 550° C. in the low pressure furnace, the substrate is maintained under vacuum pressure of 0.5 mTorr for 20 minutes. By this, the nucleus is grown to form the HSG on the surfaces of the patterned amorphous silicon layer 22b and the side wall 22w and thus forms the lower electrode 26.

Thereafter, a silicon nitride layer (not shown) to be the capacitance insulation layer is deposited on the upper surface and the side surface of the lower electrode 26 in the thickness of about 7 nm by employing thermal CVD method. Then, over the entire surface, the upper electrode 23 of the polycrystalline silicon is deposited in a thickness of about 150 nm. Subsequently, in order to electrically activate, heat treatment is performed under atmosphere of gas containing phosphorous oxytrichloride. By this, the stack type semiconductor capacitive element is formed.

Even in the second embodiment, similar to the first embodiment, even when the impurity concentration in the amorphous silicon film to be the lower electrode is increased, failure of formation of the HSG will never be caused. Also, while the second embodiment has slightly greater number of process steps in comparison with the first embodiment, the charge accumulation amount can be further increased by the presence of the HSG on the side surface of the lower electrode 26.

Hereinafter, the discussion will be given specifically for results of experiments in formation of the semiconductor capacitive element according to the shown embodiments in comparison with the results of experiments in formation of the semiconductor capacitive element by the prior art.

At first, on the surface of the predetermined substrate, an amorphous silicon film having phosphorous concentration of $2 \times 10^{20}$ (atoms/cm$^3$) was formed in a thickness of about 300 nm. Then, the HSG was formed on the surface of the amorphous silicon film by the conventional nucleus forming method. Specifically, the substrate on which the amorphous silicon film was formed was heated at a temperature of 600° C., and small amount of SiH$_4$ gas is introduced to maintain the substrate under vacuum pressure of 0.5 mTorr for 5 minutes to form the nucleus of HSG. Subsequently, under the same temperature and the same pressure, a small amount of clean N$_2$ gas was introduced to perform heat treatment for the substrate for 10 minutes. Thus, the nucleus was grown to form the HSG. The forming condition of the HSG was the condition where the good shape of the HSG was formed on the surface of the non-doped amorphous silicon film.

On the other hand, under the same HSG forming condition, the HSG was formed on the surface of the non-doped amorphous silicon film.

Then, the surface of the non-doped amorphous silicon film formed with the HSG and the surface of the phosphorous-doped amorphous silicon film with the HSG are observed by SEM photographs for comparison. As a result, uniform and good shape of the HSG was formed on the surface of the non-doped amorphous silicon film. On the other hand, on the surface of the phosphorous-doped amorphous silicon film, the forming density of the HSG was low and the average grain size of the HSG was small.

Then, observation by SEM photograph was also performed for the case where the HSG was formed on the surface of the phosphorous-doped amorphous silicon film by setting the nucleus of the HSG forming period and the annealing period were set to be double. As a result, while the formation density of the HSG and the average grain size of the HSG became comparable to the HSG formed on the non-doped amorphous silicon film, but the portions where no HSG was formed, were present locally.

Thus, when the HSG is formed on the surface of the amorphous silicon film containing high impurity concentration, the following causes are considered as a cause of formation failure of the HSG. Namely, the impurity, such as phosphorous in the silicon film interferes nucleus formation on the surface of the amorphous silicon film and blocks surface migration of the silicon molecule. Thus, the nucleus forming speed of the HSG and the surface migration speed of the silicon molecule on the surface of the phosphorous-doped amorphous silicon film are lower in comparison with those speeds on the surface of the non-doped amorphous silicon film. Therefore, the forming density of the HSG becomes low and the average grain size of the HSG becomes small.

On the longer other hand, when using the period of forming the HSG nucleus and period of annealing are provided or higher temperature is used, the phosphorous-doped amorphous silicon film is crystallized from the substrate side before formation of the HSG to stop nucleus formation of the HSG or surface migration of the silicon molecule. Accordingly, portions where no HSG is formed are presented.

Also, when the HSG was formed on the surface of the phosphorous-doped amorphous silicon film and the non-doped amorphous silicon film by the conventional annealing method, similar result to the case of the nucleus forming method was obtained. Namely, in case of the HSG was formed on the surface of the amorphous silicon film having high phosphorous concentration, the formation density of the HSG became low and the average grain size of the HSG became small.

Next, the semiconductor capacitive elements were formed by the first and second embodiments of the fabrication process according to the present invention, and in conjunction therewith, the semiconductor capacitive elements were also formed by the conventional annealing method and the nucleus forming method, and increasing of capacitance were measured.

Figure 8:
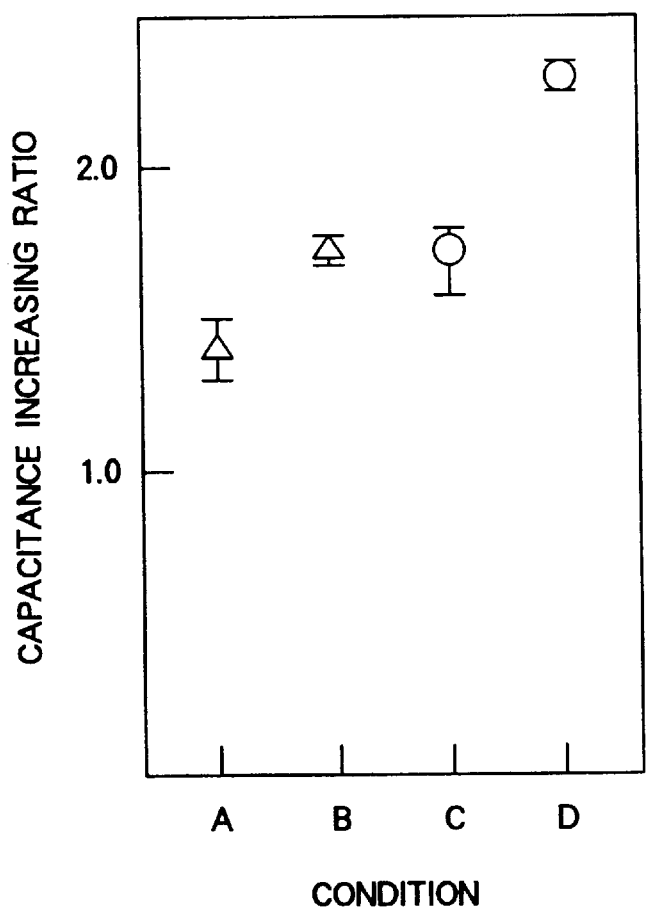
FIG. 8 is an illustration showing a comparison of the capacitance increasing ratios in various condition with taking the capacitance increasing ratio in the vertical axis and the condition in the horizontal axis.

FIG. 8 is an illustration showing a comparison of the capacitance increasing ratios in various condition with taking the capacitance increasing ratio in the vertical axis and the condition in the horizontal axis. The capacitance increasing ratio was assumed to be 1 when the HSG was not formed on the surface of the amorphous silicon film, and ratio of the capacitance increased when formation of the HSG was obtained.

In FIG. 8, the condition A shows the result derived from fabrication of the semiconductor capacitive element by the conventional annealing method, the condition B shows the result of fabrication of the semiconductor capacitive element by the first embodiment of the present invention. On the other hand, the condition C shows the result of fabrication of the semiconductor capacitive element by the conventional nucleus forming method, and the condition D shows the result of fabrication of the semiconductor capacitive element by the second embodiment of the present invention.

It should be noted that the condition A uses the amorphous silicon film containing phosphorous in concentration of $2 \times 10^{20}$ (atoms/cm$^3$), the conditions B and D use the silicon films where the phosphorous-doped silicon film having impurity concentration of $2 \times 10^{20}$ (atoms/cm$^3$) and the non-doped amorphous silicon film. Also, the conditions C and D were effected the HSG was formed after processing the amorphous silicon film into the configuration of the lower electrode in the method shown in FIGS. 2A to 2C and FIGS. 7A to 7F.

As shown in FIG. 8, when the semiconductor capacitive element was formed by the prior art, in comparison with the shown embodiment, since the only amorphous silicon film containing high phosphorous concentration was formed, the uniform and good shape of the HSG cannot be formed to make difficult to satisfactorily increase the capacitance.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process for forming a stack type semiconductor capacitive element, comprising the steps of:

selectively forming an insulation layer on the surface of a semiconductor substrate for defining an element region;

forming a first amorphous silicon film with an impurity concentration greater than or equal to $1 \times 10^{20}$ (atoms/cm$^3$) on said element region;

forming a second amorphous silicon film with an impurity concentration less than or equal to $1 \times 10^{18}$ (atoms/cm$^3$) on said first amorphous silicon film, said second amorphous silicon film and said first amorphous silicon film constituting an amorphous silicon layer for lower electrode; and forming unevenness on the surface of said amorphous silicon layer for lower electrode by a heat treatment.

2. The fabrication process for forming a semiconductor capacitive element as set forth in claim 1, further comprising the steps of:

performing patterning for said amorphous silicon layer for lower electrode after the step of formation of said unevenness to form a lower electrode;

forming a capacitance insulation layer on the surface of said lower electrode; and forming an upper electrode over the surface of said capacitance insulation layer.

3. A fabrication process of a semiconductor capacitive element as set forth in claim 1, wherein said first amorphous silicon film contains phosphorous as an impurity.

4. A fabrication process of a semiconductor capacitive element as set forth in claim 1, wherein said step of forming said first amorphous silicon film has a step of depositing said first amorphous silicon film by a reaction under atmosphere of gas containing a silane type gas and the impurity; and said step of forming said second amorphous silicon film has a step of depositing said second amorphous silicon film by a reaction under atmosphere of gas containing only said silane type gas.

5. A fabrication process of a semiconductor capacitive element as set forth in claim 1, wherein said first and second amorphous silicon films are formed at a temperature in a range of 520° to 550° C.

6. A fabrication process of a semiconductor capacitive element as set forth in claim 1, wherein said step of forming said unevenness has a step of performing heat treatment for said amorphous silicon layer for lower electrode at a temperature in a range of 550° to 580° C.

7. A fabrication process of a semiconductor capacitive element as set forth in claim 1, wherein said step of forming said unevenness has the steps of:

performing heat treatment for said amorphous silicon layer for lower electrode at a temperature in a range of 550° to 580° C. under silane type gas atmosphere; and leaving at the same temperature and the same pressure as that in said heat treatment process.

8. A fabrication process of a semiconductor capacitive element as set forth in claim 1, wherein said semiconductor substrate is made of an n-type semiconductor layer.

9. A fabrication process of a semiconductor capacitive element as set forth in claim 1, wherein said semiconductor substrate has an n-type semiconductor region on the surface.

10. A fabrication process for forming a stack type semiconductor capacitive element, comprising the steps of:

selectively forming an insulation layer on the surface of a semiconductor substrate for defining an element region;

forming a first amorphous silicon film with an impurity concentration greater than or equal to $1 \times 10^{20}$ (atoms/cm$^3$) on said element region;

forming a second amorphous silicon film with an impurity concentration less than or equal to $1 \times 10^{18}$ (atoms/cm$^3$) on said first amorphous silicon film, said second amorphous silicon film and said first amorphous silicon film constituting an amorphous silicon layer for lower electrode;

patterning said amorphous silicon layer for lower electrode to form a patterned amorphous silicon layer;

forming a side wall of amorphous silicon with an impurity concentration less than or equal to $1 \times 10^{18}$ (atoms/cm$^3$) on the side surface of said patterned amorphous silicon layer; and forming unevenness on the surfaces of said patterned amorphous silicon layer and said side wall by heat treatment and whereby forming a lower electrode having patterned amorphous silicon layer and said side wall with said unevenness.

11. A fabrication process of a semiconductor capacitive element as set forth in claim 10, wherein said first amorphous silicon film contains phosphorous as an impurity.

12. A fabrication process of a semiconductor capacitive element as set forth in claim 10, wherein said step of forming said first amorphous silicon film has a step of depositing said first amorphous silicon film by a reaction under atmosphere of gas containing a silane type gas and the impurity;

said step of forming said second amorphous silicon film has a step of depositing said second amorphous silicon film by a reaction under atmosphere of gas containing only said silane type gas; and said step of forming said side wall has a step of forming a third amorphous silicon film on upper surface and side surface of said patterned amorphous silicon layer and a step of performing anisotropic etching for leaving said third amorphous silicon film only on the side surface of said patterned amorphous silicon layer.

13. A fabrication process of a semiconductor capacitive element as set forth in claim 10, wherein said first to third amorphous silicon films are formed at a forming temperature in a range of 520° to 550° C.

14. A fabrication process of a semiconductor capacitive element as set forth in claim 10, wherein said step of forming said unevenness has a step of performing heat treatment for said patterned amorphous silicon layer and said side wall at a temperature in a range of 550° to 580° C.

15. A fabrication process of a semiconductor capacitive element as set forth in claim 10, wherein said step of forming said unevenness comprises the steps of:

performing heat treatment for said patterned amorphous silicon layer and said side wall at a temperature in a range of 550° to 580° C. under silane type gas atmosphere; and leaving at the same temperature and the same pressure as that in said heat treatment process.

16. A fabrication process of a semiconductor capacitive element as set forth in claim 10, wherein said semiconductor substrate is made of an n-type semiconductor layer.

17. A fabrication process of a semiconductor capacitive element as set forth in claim 10, wherein said semiconductor substrate has an n-type semiconductor region on the surface.

18. A fabrication process of a semiconductor capacitive element as set forth in claim 10, further comprising the steps of:

forming a capacitance insulation layer over the surface of said lower electrode; and forming an upper electrode over the surface of said capacitance insulation layer.

19. A fabrication process for forming a stack type semiconductor capacitive element, comprising the steps of:

forming a lower electrode of said stack type semiconductor capacitive element including the steps of:

forming a first doped amorphous silicon film having an impurity concentration greater than or equal to $1 \times 10^{20}$ (atoms/cm$^3$);

forming a second doped amorphous silicon film on said first amorphous silicon film, said second doped amorphous silicon film having an impurity concentration less than or equal to $1 \times 10^{18}$ (atoms/cm$^3$); and heating said first doped amorphous silicon film and said second doped amorphous silicon film to form crystal nucleus of a hemispherical grain (HSG) on a surface of said lower electrode.

20. The fabrication process as set forth in claim 19, wherein said step of heating to form crystal nucleus of HSG on a surface of said lower electrode is performed at a temperature in a range of about 550° to 580° C.

21. The fabrication process as set forth in claim 20, wherein said step of heating to form unevenness on a surface of said lower electrode is further performed in a silane type gas atmosphere to form said crystal nucleus of HSG, and further includes the step of growing said crystal nucleus by maintaining a same temperature and a same pressure as performed in said heating step.

22. The fabrication process as set forth in claim 19, wherein said step of forming a lower electrode further comprises the steps of:

patterning said first doped amorphous silicon film and said second doped amorphous silicon film prior to heating to form unevenness on a surface of said lower electrode; and forming a side wall of amorphous silicon having impurity concentration less than or equal to $1 \times 10^{18}$ (atoms/cm$^3$) on the side surface of said patterned first doped amorphous silicon film and said patterned second doped amorphous silicon film.

* * * * *